(12) United States Patent
Parks

(10) Patent No.: US 7,456,891 B2
(45) Date of Patent: Nov. 25, 2008

(54) MULTIPLE READ PHOTODIODE

(75) Inventor: Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 871 days.

(21) Appl. No.: 10/460,604

(22) Filed: Jun. 12, 2003

(65) Prior Publication Data

US 2004/0252216 A1 Dec. 16, 2004

(51) Int. Cl.
*H04N 3/14* (2006.01)
*H04N 5/335* (2006.01)

(52) U.S. Cl. .................................... 348/312; 348/314
(58) Field of Classification Search ................ 348/312, 348/296, 362, 364, 311, 314; 257/229, 230
See application file for complete search history.

(56) References Cited

U.S. PATENT DOCUMENTS 4,492,980 A * 1/1985 Harada ........................ 348/245
5,113,365 A * 5/1992 Yang .......................... 708/801
7,050,101 B2 * 5/2006 Wako et al. ................. 348/314

FOREIGN PATENT DOCUMENTS

| EP | 60109271 | 6/1985 |
|---|---|---|
| EP | 0 273 831 A2 | 7/1988 |
| EP | 01053686 | 3/1989 |
| EP | 01125073 | 5/1989 |
| EP | 0 340 678 A2 | 11/1989 |

* cited by examiner

*Primary Examiner*—Sinh Tran
*Assistant Examiner*—Justin P Misleh
(74) *Attorney, Agent, or Firm*—Peyton C. Watkins

(57) ABSTRACT

A photo sensing region is included within each pixel in a pixel array. Each photo sensing region collects photo-generated charge. A transfer region is positioned between each photo sensing region and a respective charge coupled device. A charge-coupled device receives charge from each column of pixels in the pixel array. Each charge-coupled device includes one or more barriers for causing the transfer of the charge through the charge-coupled device. Each transfer region includes a barrier that is lower than the one or more barriers in the charge-coupled device so that excess charge in the charge-coupled device flows into the photo sensing region.

24 Claims, 8 Drawing Sheets

MULTIPLE READ PHOTODIODE

FIELD OF THE INVENTION

The invention relates generally to the field of image sensors having a photodiode adjacent a charge-coupled device (CCD) and, more particularly, to such image sensors in which the CCD receives its maximum capacity of charge from the photodiode and any excess charge capacity of the photodiode charge flows back into the photodiode. This stored excess charge in the photodiode is subsequently transferred back out to the CCD and added to the charge for that particular photodiode.

BACKGROUND OF THE INVENTION

The typical structure of an interline CCD pixel 5 is shown in FIG. 1. It consists of a photodiode 10 adjacent to a CCD 20. The photodiode 10 converts incident light photons into charge. The transfer of charge through the CCD 20 is generally controlled by at least two control gates, 40 and 50. One of the gates 50 has a transfer gate region 30 which controls the transfer of charge from the photodiode 10 to the CCD 20. The pixels 5 are arranged in a two-dimensional array of at least one row and one column.

FIG. 2 shows a cross section A-B of FIG. 1. This cross section shows the additional detail of the pixel 5 including the gate insulator 70 separating the gate 50 from the CCD 20. There is also a light shield 60 to prevent photo charge from being generated in the CCD 20. The photodiode 10 charge is cleared by applying a high voltage pulse to the substrate 80.

The typical sequence of events in a camera to acquire an image using an external shutter are (a) open external shutter to start the exposure time; (b) wait for the desired exposure time; (c) close the external shutter to end the exposure time; (d) transfer charge from the photodiode 10 to the CCD 20; and (e) transfer charge through the CCD 20 by clocking the control gates 40 and 50 to move charge towards a charge measurement structure.

Sometimes very short exposure times are desired, i.e., much shorter than what can be obtained by an external shutter. In this case, the electronic shuttering capabilities of an interline CCD are used. The typical sequence of events to acquire an image using the electronic shutter are (a) open external shutter; (b) pulse the substrate 80 voltage to clear the photodiode 10; (c) wait for the desired exposure time; (d) transfer charge from the photodiode 10 to the CCD 20 to end the exposure time; (e) close the external shutter; (e) transfer charge through the CCD 20 by clocking the control gates 40 and 50 to move charge towards a charge measurement structure. When using the electronic shutter every pixel must transfer its charge from the photodiodes to the CCD simultaneously. The simultaneous charge transfer prevents unwanted artifacts when capturing an image of a fast moving object. The charge capacity of the photodiodes must be designed to be smaller than the charge capacity of the CCD. If the photodiodes contain more charge than the charge capacity of the CCD, the CCD will overflow. This is commonly referred to as blooming image defects.

FIG. 3, which is a cross section from point A to point C in FIG. 1, illustrates how blooming occurs in the CCD. The cross section begins in the photodiode 10, goes through the transfer gate region 30, and then up the CCD 20. The CCD in FIG. 3 also shows barrier implants 90 and 95 which are used to modify the potential energy in the CCD channel 20 to control the direction of charge transfer. At time T1 of FIG. 3 the CCD is empty and the photodiode contains a full charge packet. In this case, to illustrate blooming, the charge packet is larger than the capacity of the CCD. At time T2 the gate 50 over the transfer gate region is set to a high voltage level which lowers the barrier between the photodiode and CCD. All charge flows from the photodiode into the CCD. Then at time T3, the gate 50 is returned to its normal low level. Since the charge packet does not fit entirely under gate 50, charge spills backwards into gate 40.

The invention described here overcomes the problem of the photodiodes containing more charge than the charge capacity of the CCD that leads to blooming image artifacts.

SUMMARY OF THE INVENTION

The present invention is directed to overcoming one or more of the problems set forth above. Briefly summarized, according to one aspect of the present invention, the invention resides in a method for transferring charge from a photo sensing region to a charge-coupled device in an image sensor, the method comprising the steps of (a) providing a plurality of pixels including a photo sensing region for collecting photo-generated charge and a charge-coupled device region between which is a transfer region; (b) providing a barrier in the charge-coupled device for causing the transfer of the charge through the charge-coupled device; and (c) providing the transfer region having a lower barrier than the charge-coupled device so that excess charge in the charge-coupled device flows into the photo sensing region.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the advantage of preventing blooming artifacts while also preserving all of the original charge in the photodiode for subsequent readout.

DETAILED DESCRIPTION OF THE INVENTION

Figure 1:
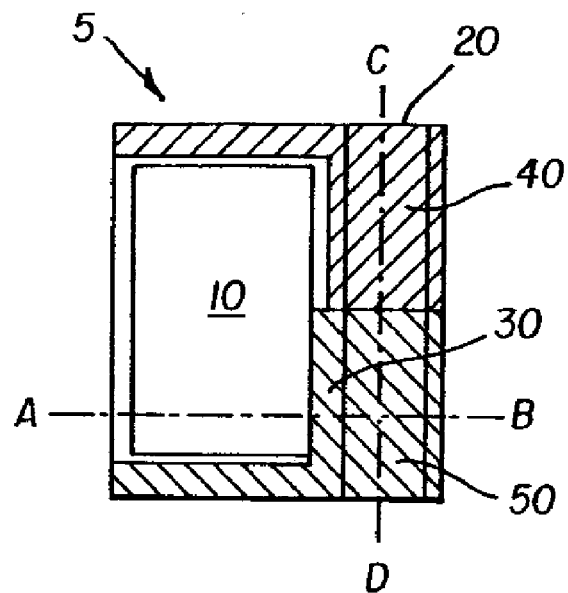
FIG. 1 is a top view of a prior art CCD.
Figure 2:
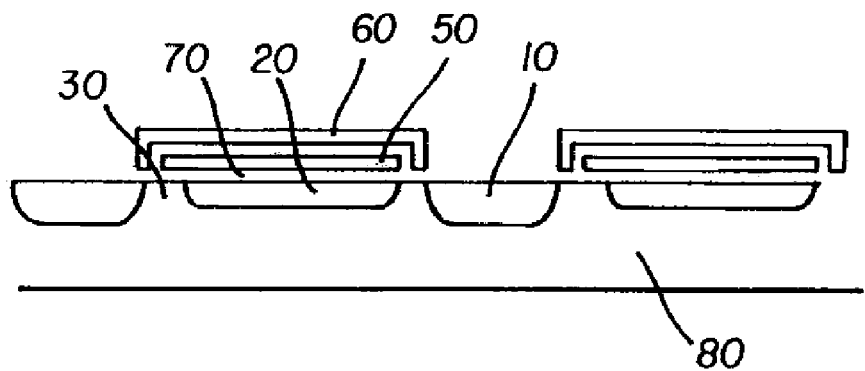
FIG. 2 is a side view along line A-B of the prior art CCD of FIG. 1.
Figure 3:
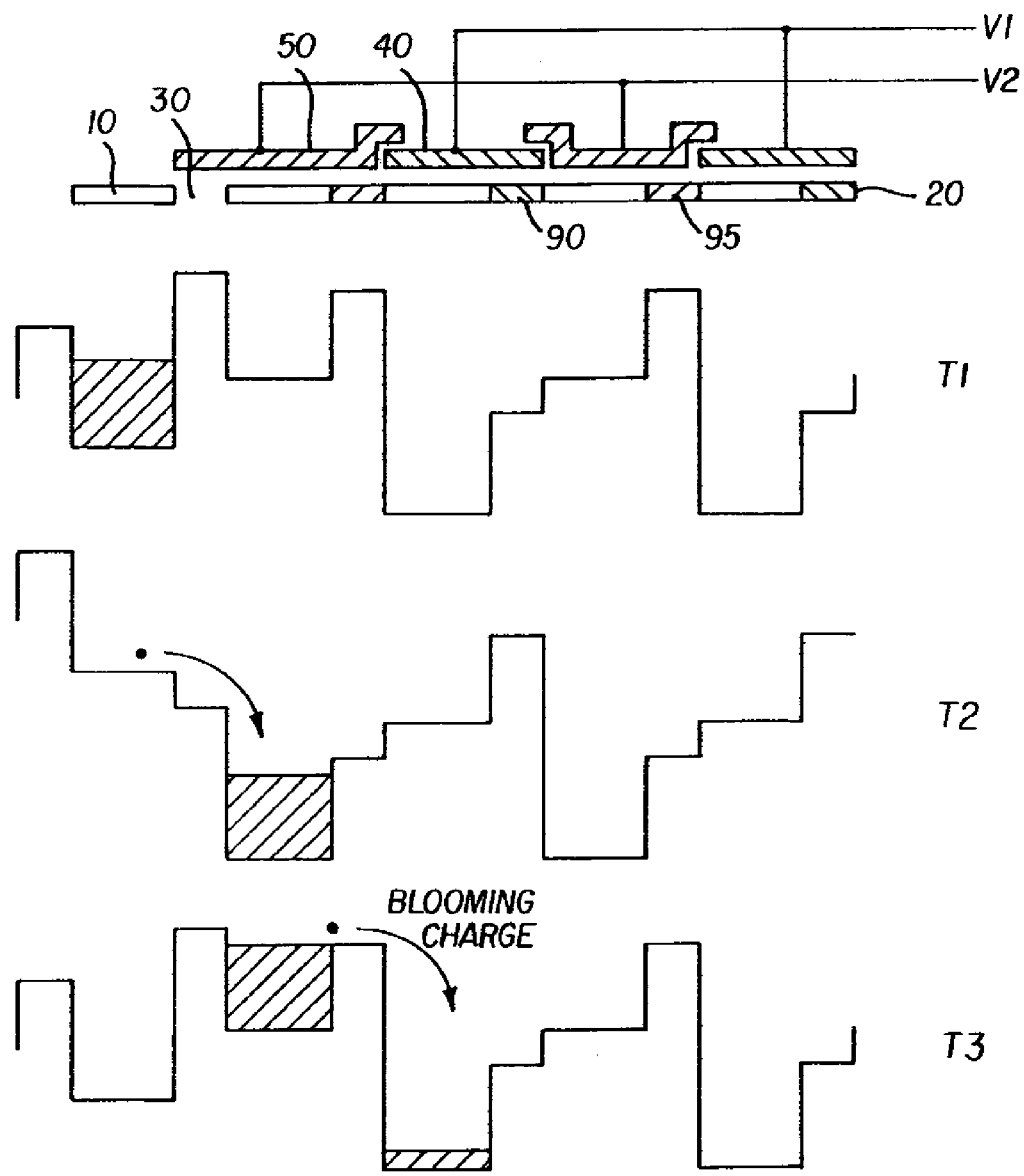
FIG. 3 is a timing diagram of FIG. 1 illustrating readout.
Figure 4:
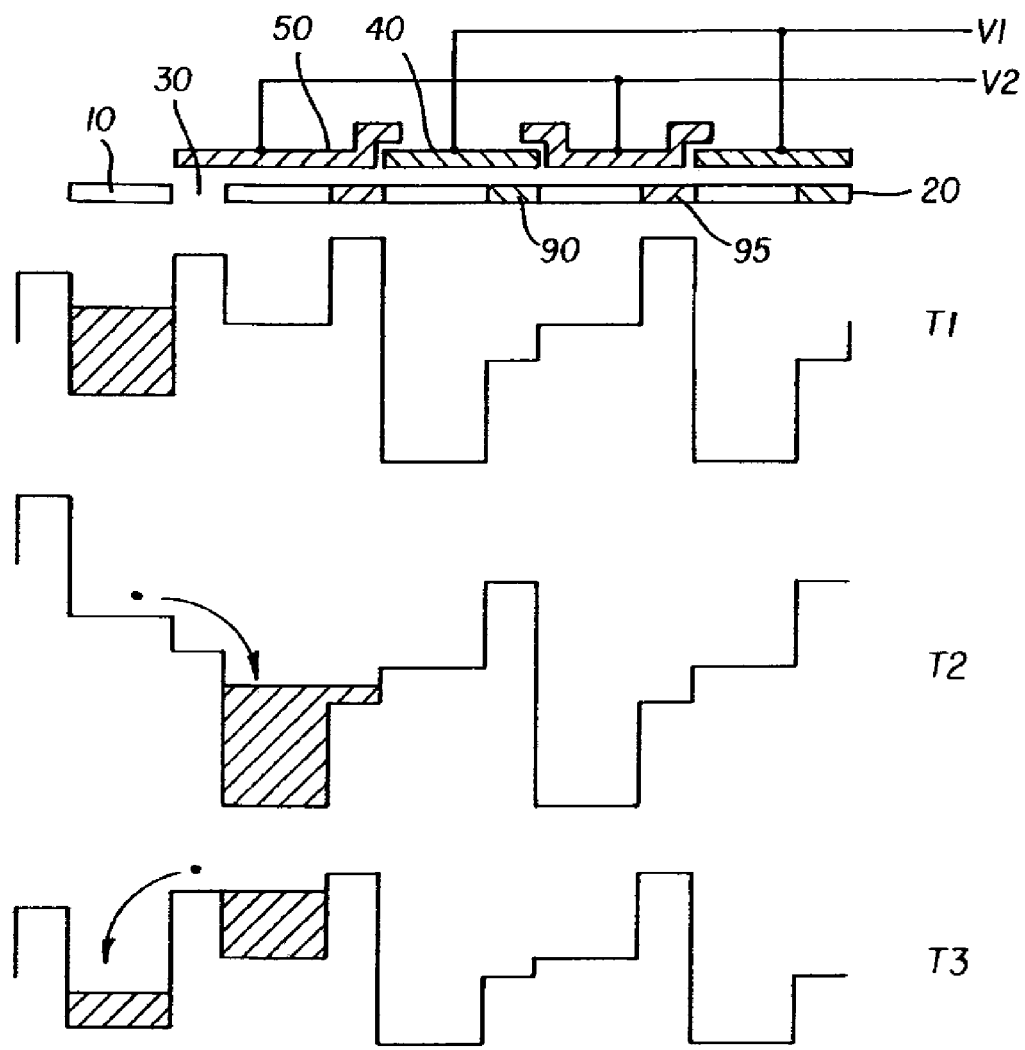
FIG. 4 is a timing diagram of the image sensor of the present invention.

The first embodiment of the invention is shown in FIG. 4. It is instructive to note the difference of the transfer gate region 30 potential from the prior art. The potential in the transfer gate region 30 is adjusted such that it is deeper than the barriers 90 and 95 in the CCD 20. The deeper transfer gate region barrier will allow excess charge in the CCD to overflow into the photodiode instead of overflowing (blooming) into neighboring CCD gates as in the prior art. At time T1 in FIG. 4 the photodiode is full of charge and ready for transfer into the CCD. At time T2 the gate 50 voltage is set to the high level to lower the barrier between the photodiode and CCD and allow charge to transfer across the transfer gate region 30. At T3, when the gate 50 voltage is returned to its normal low level excess charge flows back through the transfer gate region into the photodiode.

Another advantage to this embodiment is the charge that overflows back into the photodiode may still be used. After the charge in the CCD is transferred out of the CCD and measured, the excess charge in the photodiode may be transferred back into the now empty CCD. The excess charge is then transferred out of the CCD and measured. The two measurements are added together to recover the total amount of charge that was originally in the photodiode. The result is that the entire photodiode charge was measured even though it exceeded the CCD charge handling capacity. This is analogous to a person emptying a large bucket of water with a smaller bucket by filling the small bucket multiple times. In the invention, the smaller charge capacity CCD empties the larger photodiode by transferring small amounts of charge from the photodiodes multiple times.

Figure 5:
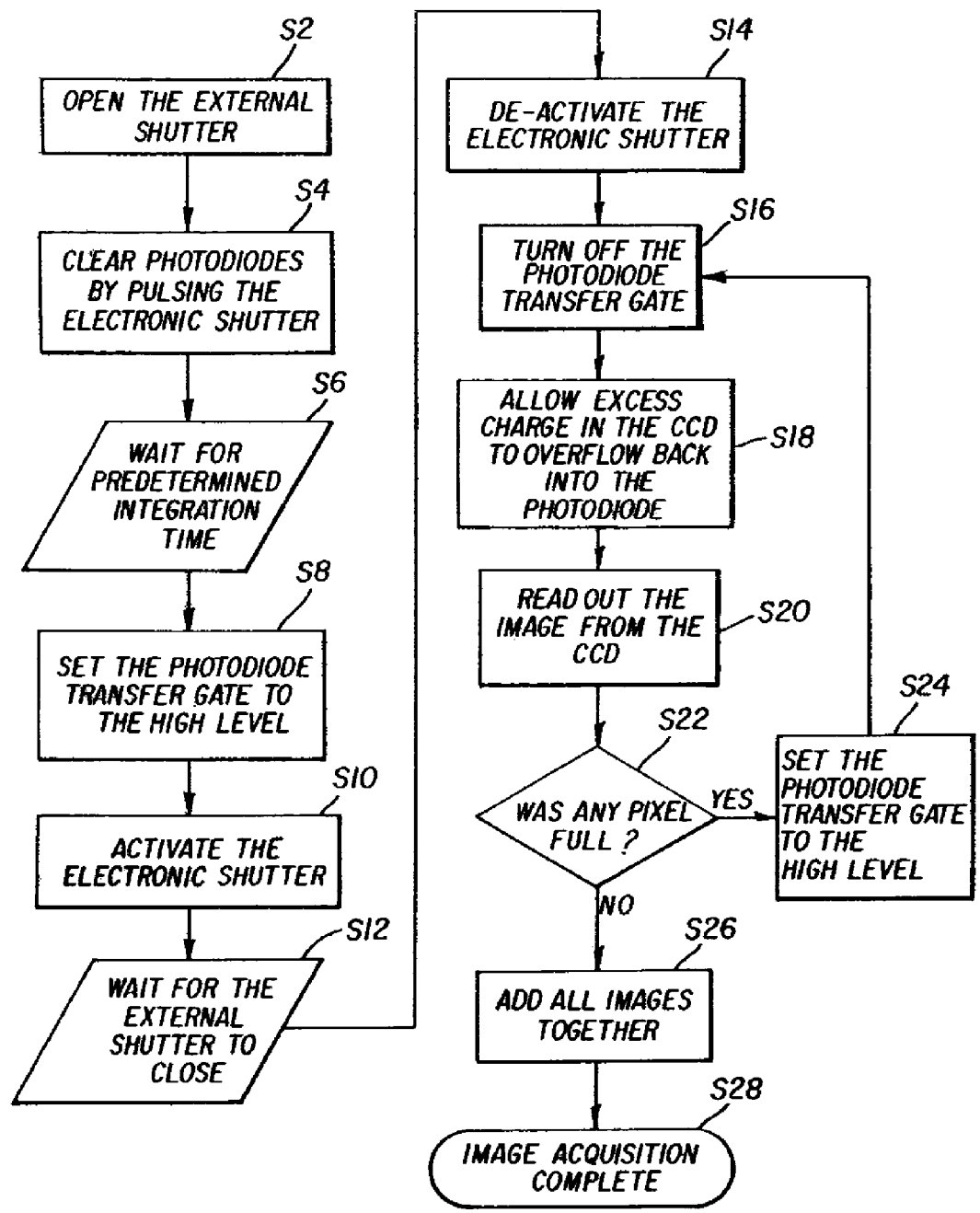
FIG. 5 is a flowchart for image capture using the image sensor of the present invention.
Figure 6:
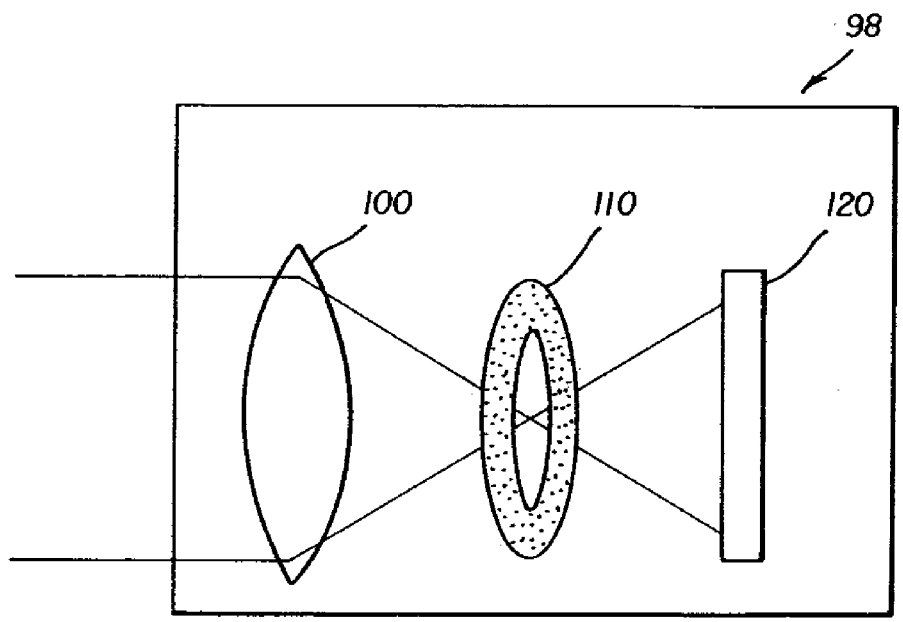
FIG. 6 is an illustration of a camera for implementing the present invention.

FIG. 5 is a flow chart showing the complete image capture sequence of a camera 98 employing the first embodiment of the invention. The camera 98 shown in FIG. 6 consists of a lens 100, an external shutter 110, and the interline CCD image sensor 120. The image capture sequence of FIG. 5 begins by opening the external shutter S2 to expose the sensor to the image formed by the camera lens. The entire array of photodiodes is cleared by employing the electronic shuttering capabilities of the interline CCD S4. This marks the start of the image integration time. At the end of the integration time S6, transfer gate region 30 is turned on and held in the on state S8. After the charge is transferred to the CCD from the photodiode, the electronic shutter is turned back on and held on to prevent further accumulation of charge in the photodiodes S10. The electronic shutter is turned off S14 only after the external shutter has fully closed S112. Now the transfer gate region 30 is turned off S16. If the photodiodes contained more charge than what will fit in the CCD, then the excess is allowed to overflow back into the photodiodes S18. Now the image is read out of the CCD S20. If any pixel of the image contained enough charge to fill the CCD then there is a possibility that there is still some charge remaining in the photodiode for that pixel S22. The photodiodes are read out a second time S24 to obtain the charge that overflowed from the CCD back into the photodiodes. This process is repeated until the photodiodes have all been emptied. If the photodiodes had to be read out more than once, then the second (and if needed third images) are added together S26 to reconstruct the final image S28.

Figure 7:
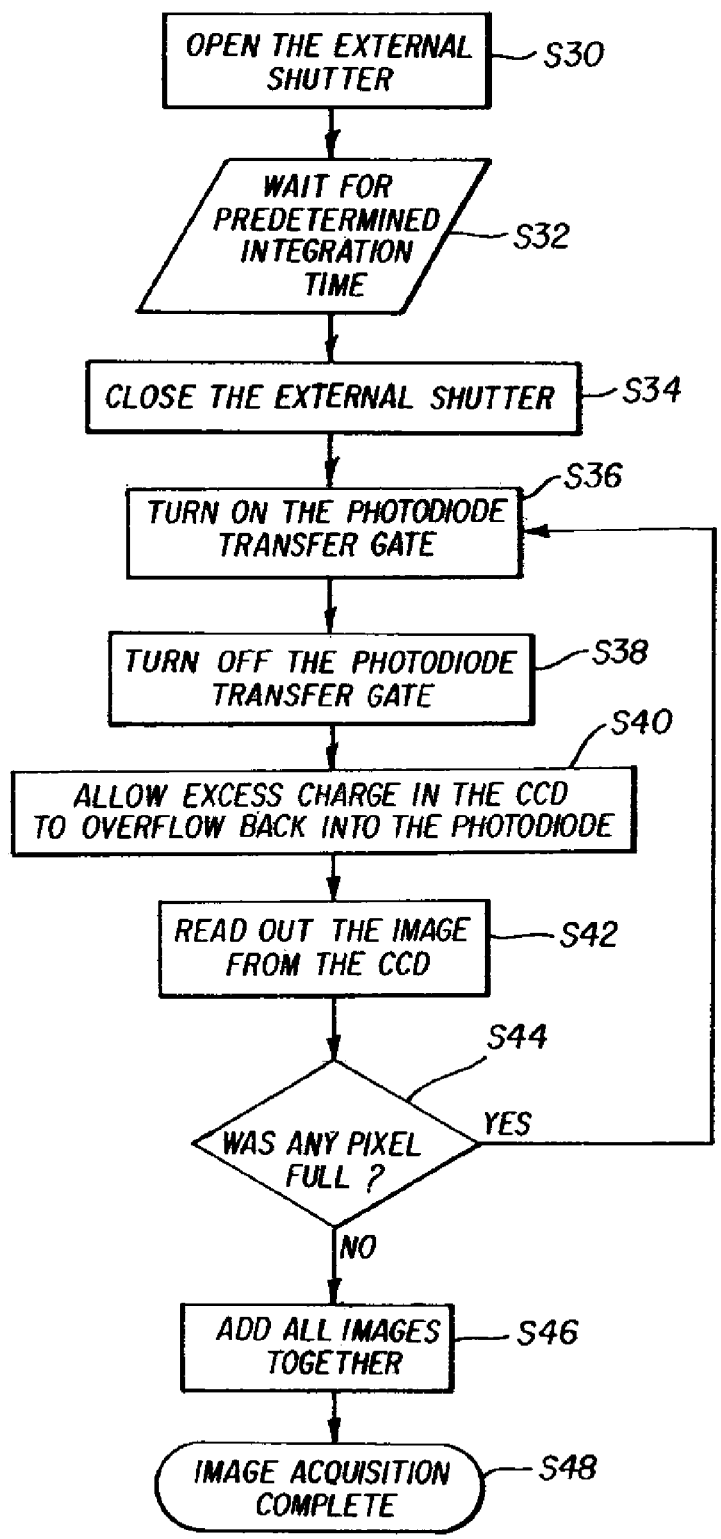
FIG. 7 is a flowchart illustrating image capture steps for an exemplary practical application of the present invention.

FIG. 7 shows the image capture sequence of the first embodiment of the invention for the case of no electronic shuttering. The sequence begins with all of the image sensor photodiodes empty. The external shutter is opened S30 and closed S34 to expose the image sensor to the image for a predetermined exposure time S32. The exposure time is controlled entirely by the external shutter. The external shutter is used to prevent additional accumulation of charge by the photodiodes during image readout. Next the transfer gate region is turned on S36 to transfer charge from the photodiode to the CCD. When the transfer gate region is turned off S38, a short delay allows excess charge in the CCD to overflow back into the photodiode S40. The image in the CCD is then readout and stored S42. If any pixel of the image corresponds to a full charge packet in the CCD S44, then it is likely that there is still overflow charge left in the photodiodes. The photodiode readout sequence is repeated until most pixels are below the charge capacity of the CCD. At the end of the sequence, the stored images are added together S46 to reconstruct the final image S48. It shall be noted as obvious that the images may be added together while they are being read out of the image sensor so that only enough memory is required to hold just one image.

Figure 8:
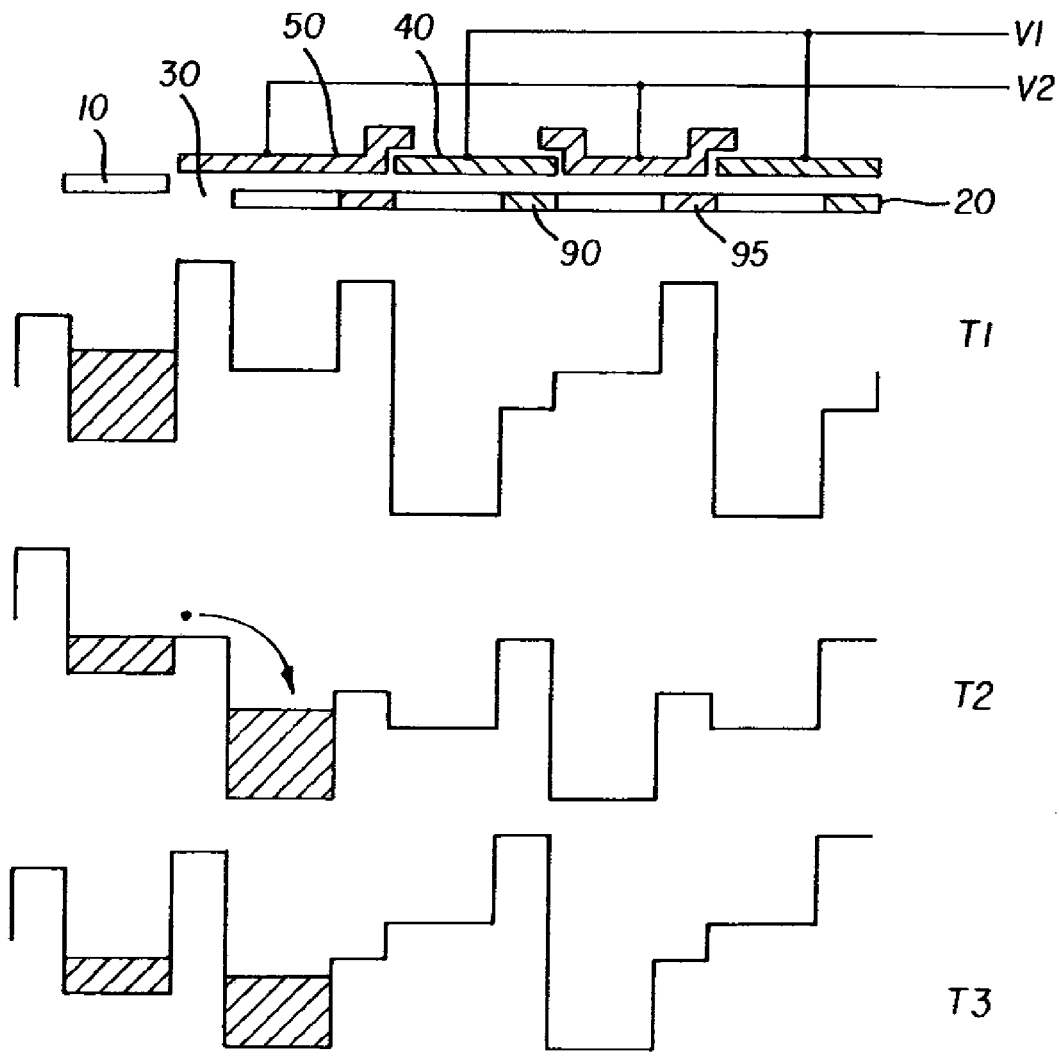
FIG. 8 is an alternative embodiment of the present invention.
Figure 9:
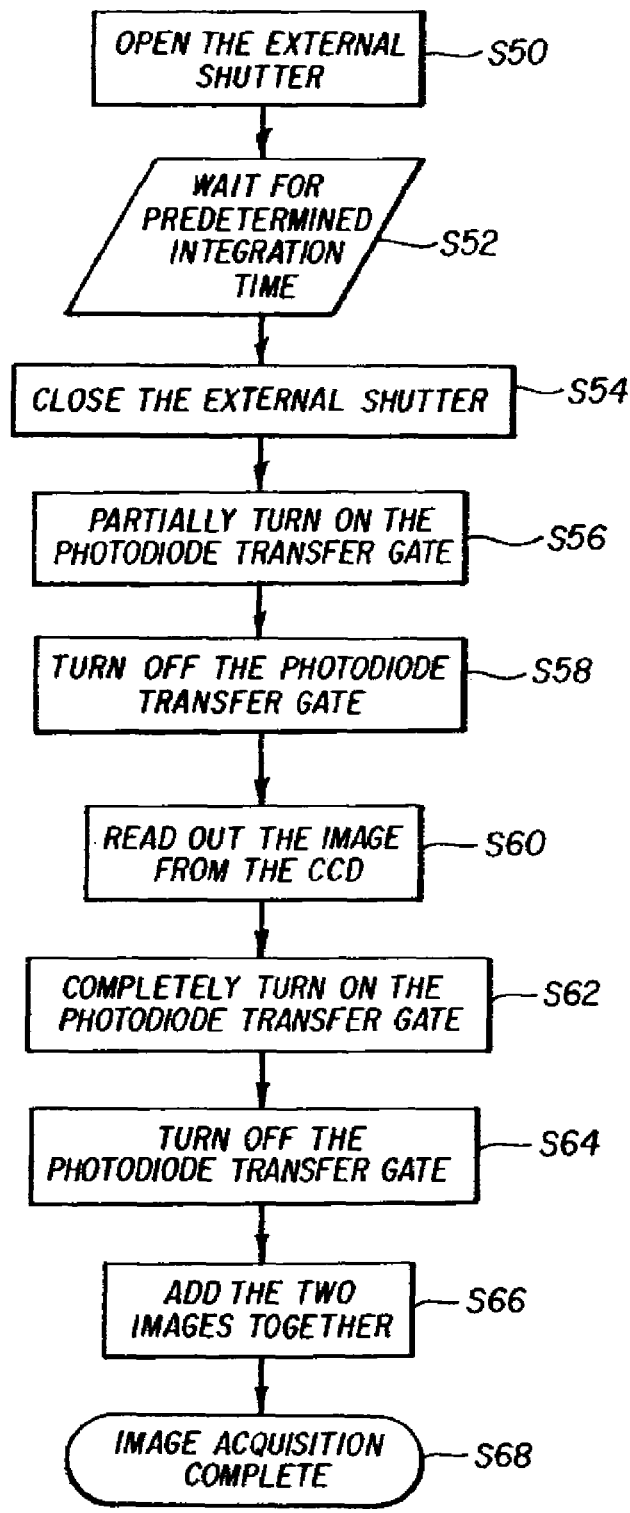
FIG. 9 is a flowchart illustrating image capture steps for an exemplary practical application of the alternative embodiment of the present invention.

An alternative embodiment of the present invention is shown in FIG. 8. It is instructive to note the difference in the image capture sequence as compared to the prior art. The sequence begins with all of the image sensor photodiodes empty. Referring to FIGS. 8 and 9, the external shutter is opened S50 and closed S54 to expose the image sensor to the image for a predetermined exposure time S52. The exposure time is controlled entirely by the external shutter. The external shutter is used to prevent additional accumulation of charge by the photodiodes during image readout. This portion of the image capture sequence is shown by the potential energy diagram at time T1 of FIG. 8.

Next at time T2 of FIG. 8, the transfer gate region is turned partially on S56 to transfer charge from the photodiode to the CCD. The amount that the transfer gate region is turned on is only that which is required to fill the CCD with charge. The photodiode transfer gate is turned off S58. At T3, there will still be some charge in the photodiodes that is not transferred to the CCD.

Next in the image capture sequence of FIG. 9 the first image is read out S60 of the CCD and stored in memory. Then the transfer gate region is turned on again S62. This time the transfer gate region is turned on enough to allow complete transfer of charge from the photodiodes to the CCD. Next the transfer gate region is turned off S64 and a second image is read out of the CCD. The first and second images are then added together S66 to reconstruct the final image S68.

It shall be noted as obvious that image capture sequence of FIG. 9 may be extended beyond two photodiode readout steps to three or more readout steps.

The invention has been described with reference to a preferred embodiment. However, it will be appreciated that variations and modifications can be effected by a person of ordinary skill in the art without departing from the scope of the invention.

PARTS LIST

5 interline CCD pixel
10 photodiode
20 CCD
30 transfer gate region
40 control gate
50 control gate
60 light shield
70 gate insulator
80 substrate
90 barrier implants
95 barrier implants
98 camera
100 lens
110 external shutter
120 image sensor

What is claimed is:

1. A method for transferring charge from a photo sensing region to a charge-coupled device in an image sensor, the method comprising the steps of:

(a) providing the photo sensing region in a pixel for collecting photo-generated charge, wherein the pixel is included in a plurality of pixels;
(b) providing a transfer region between the photo sensing region and a charge-coupled device;
(c) providing one or more barriers in the charge-coupled device for causing the transfer of the charge through the charge-coupled device; and
(d) providing a lower baffler in the transfer region than the one or more barriers in the charge-coupled device so that an amount of photo-generated charge in the charge-coupled device that exceeds a charge capacity of the charge-coupled device flows into the photo sensing region.

2. The method as in claim 1 further comprising the step of: (e) reading out a first image, wherein step (e) comprises the steps of (e1) lowering the barrier of the transfer region to cause the transfer of charge from the photo sensing region to the charge-coupled device; (e2) raising the barrier of the transfer region to allow the amount of photo-generated charge in the charge-coupled device that exceeds the charge capacity of the charge-coupled device to flow into the photo sensing region; and (e3) alternately lowering and raising the barrier and one or more additional barriers in the charge-coupled device for reading out the image.

3. The method as in claim 2 further comprising the steps of repeating steps (e1), (e2) and (e3) for reading out a second image.

4. The method as in claim 3 further comprising the step of adding the first and second images for providing a final image containing substantially all the charge that was originally in the photo sensing region.

5. The method as in claim 4 further comprising the step of repeating steps (e1), (e2) and (e3) for providing a third image and adding the third image to the final image.

6. The method as in claim 5 further comprising the step of repeating steps (e1), (e2) and (e3) and adding to the previously added images until all the charge is transferred from the photo sensing region.

7. The method as in claim 2 further comprising the step of closing a shutter before initiating step (e1) so that no additional charge is generated in the photo sensing region.

8. The method as in claim 1 further comprising the step of (f) opening a first shutter external to the image sensor; (g) clearing the charge from the photosensing region by using an electronic shutter; (h) integrating the photo sensing region; (i) lowering the baffler of the transfer region to cause the transfer of charge from the photo sensing region to the charge-coupled device; (j) turning on the electronic shutter; (k) closing the first external shutter; (l) turning off the electronic shutter; (m) raising the barrier of the transfer region to allow the amount of photo-generated charge in the charge-coupled device that exceeds the charge capacity of the charge-coupled device to flow into the photo sensing region; and (n) alternately lowering and raising the barrier and one or more additional barriers in the charge-coupled device for reading out the first image.

9. The method as in claim 8 further comprising the steps of repeating steps (i), (m), and (n) for reading out a second image.

10. The method as in claim 9 further comprising the step of adding the first and second images for providing a final image containing substantially all the charge that was originally in the photo sensing region.

11. The method as in claim 10 further comprising the step of repeating steps (i), (m), and (n) for providing a third image and adding the third image to the final image.

12. The method as in claim 11 further comprising the step of repeating steps (i), (m), and (n) and adding to the previously added images until all the charge is transferred from the photo sensing region.

13. A camera for transferring charge from a photo sensing region to a charge-coupled device in an image sensor, the camera comprising:
(a) a pixel included within a plurality of pixels, wherein the pixel includes the photo sensing region for collecting photo-generated charge;
(b) a transfer region between the photo sensing region and a charge-coupled device; and
(c) one or more barriers in the charge-coupled device for causing the transfer of the charge through the charge-coupled device; wherein the transfer region includes a lower barrier than the one or more barriers in the charge-coupled device so that an amount of photo-generated charge in the charge-coupled device that exceeds a charge capacity of the charge-coupled device flows into the photo sensing region.

14. The camera as in claim 13 further comprising: (d) a mechanism for reading out a first image, wherein the reading mechanism further comprises (d1) a mechanism for lowering the barrier of the transfer region to cause the transfer of charge from the photo sensing region to the charge-coupled device; (d2) a mechanism for raising the baffler of the transfer region to allow the amount of charge in the charge-coupled device that exceeds the charge capacity of the charge-coupled device to flow into the photo sensing region; and (d3) a mechanism for alternately lowering and raising the barrier and one or more additional barriers in the charge-coupled device for reading out the image.

15. The camera as in claim 14 further comprising a mechanism for repeating the functions of (d1), (d2) and (d3) for reading out a second image.

16. The camera as in claim 15 further comprising a mechanism for adding the first and second images for providing a final image containing substantially all the charge that was originally in the photo sensing region.

17. The camera as in claim 16 further comprising a mechanism for repeating the functions of (d1), (d2) and (d3) for providing a third image and adding the third image to the final image.

18. The camera as in claim 17 further comprising a mechanism for repeating the functions of (d1), (d2) and (d3) and a mechanism for adding to the previously added images until all the charge is transferred from the photo sensing region.

19. The camera as in claim 15 further comprising a mechanism for closing a shutter before initiating the function of (d1) so that no additional charge is generated in the photo sensing region.

20. The camera as in claim 13 further comprising (e) a mechanism for opening a first shutter external to the image sensor; (f) a mechanism for clearing the charge from the photosensing region by using an electronic shutter; (g) a mechanism for integrating the photo sensing region; (h) a mechanism for lowering the barrier of the transfer region to cause the transfer of charge from the photo sensing region to the charge-coupled device; (i) a mechanism for turning on the electronic shutter; (j) a mechanism for closing the first external shutter; (k) a mechanism for turning off the electronic shutter; (l) a mechanism for raising the barrier of the transfer region to allow the amount of charge in the charge-coupled device that exceeds the charge capacity of the charge-coupled device to flow into the photo sensing region; and (m) a mechanism for alternately lowering and raising the barrier and one or more additional barriers in the charge-coupled device for reading out the first image.

21. The camera as in claim 20 further comprising a mechanism for repeating the functions of (h), (l) and (m) for reading out a second image.

22. The camera as in claim 21 further comprising a mechanism for adding the first and second images for providing a final image containing substantially all the charge that was originally in the photo sensing region.

23. The camera as in claim 22 further comprising a mechanism for repeating the functions of (h), (l) and (m) for providing a third image and adding the third image to the final image.

24. The camera as in claim 23 further comprising a mechanism for of repeating the functions of (h), (l) and (m) and adding to the previously added images until all the charge is transferred from the photo sensing region.

* * * * *

UNITED STATES PATENT AND TRADEMARK OFFICE
CERTIFICATE OF CORRECTION

PATENT NO. : 7,456,891 B2  
APPLICATION NO. : 10/460604  
DATED : November 25, 2008  
INVENTOR(S) : Christopher Parks Page 1 of 1

It is certified that error appears in the above-identified patent and that said Letters Patent is hereby corrected as shown below:

Column 5, line 9    Please delete "baffler" and insert --barrier--.

Column 5, line 47   Please delete "baffler" and insert --barrier--.

Column 6, line 26   Please delete "baffler" and insert --barrier--.

Signed and Sealed this

Twelfth Day of May, 2009

JOHN DOLL  
*Acting Director of the United States Patent and Trademark Office*